United States Patent [19]

Kumagai et al.

[11] Patent Number: 5,013,679
[45] Date of Patent: May 7, 1991

[54] CELL CAPACITOR OF A DYNAMIC RANDOM ACCESS MEMORY AND A METHOD OF MANUFACTURING THE SAME

[75] Inventors: Jumpei Kumagai; Susumu Yoshikawa, both of Yokohama, Japan

[73] Assignee: Kabushiki Kaisha Toshiba, Kawasaki, Japan

[21] Appl. No.: 403,292

[22] Filed: Sep. 5, 1989

[30] Foreign Application Priority Data

Sep. 9, 1988 [JP] Japan .................. 63-225912

[51] Int. Cl.⁵ .......................... H01L 21/70
[52] U.S. Cl. ..................... 437/52; 437/38; 437/47; 437/51; 437/60; 437/83; 437/89; 437/99; 437/203; 437/233; 437/235; 437/919
[58] Field of Search .............. 437/38, 47, 51, 52, 437/60, 83, 89, 99, 228, 203, 233, 235, 919; 357/23.6, 51

[56] References Cited

U.S. PATENT DOCUMENTS

| | | | |
|---|---|---|---|
| 4,734,384 | 3/1988 | Tsuchiya | 437/52 |
| 4,761,385 | 8/1988 | Pfiester | 437/52 |
| 4,784,964 | 11/1988 | Nitayama | 437/52 |
| 4,786,954 | 11/1988 | Morie et al. | 357/23.4 |
| 4,927,779 | 5/1990 | Dhong et al. | 437/203 |

FOREIGN PATENT DOCUMENTS

| | | | |
|---|---|---|---|
| 0202515 | 11/1986 | European Pat. Off. | 357/23.6 |
| 3640363 | 8/1987 | Fed. Rep. of Germany | 357/23.6 |
| 0136366 | 7/1985 | Japan | 357/23.6 |
| 0287258 | 12/1986 | Japan | 357/23.6 |

OTHER PUBLICATIONS

V. J. Silvestri, "Selective Epitaxial Trench", J. of Electrochem. Soc., Jul. 1988; pp. 1808–1812.
Nakajima et al., "An Isolation-Merged Vertical Capacitor Cell For Large Capacity DRAM", IEDM Technical Digest, pp. 240–243, 1984.
Japanese Patent disclosure (Kokai) No. 61-88554, Morie et al., May 6, 1986.

*Primary Examiner*—Brian E. Hearn
*Assistant Examiner*—Tom Thomas
*Attorney, Agent, or Firm*—Finnegan, Henderson, Farabow, Garrett, and Dunner

[57] ABSTRACT

In a cell capacitor of a dynamic random access memory cell according to the present invention, an insulation film is formed on the surface of a fine trench formed in a silicon semiconductor substrate. A contact hole is formed in the insulation film in a region on the side wall of the trench. A polysilicon film is formed on the side wall of the trench in a hollow-cylindrical shape. A silicon layer is epitaxially and selectively grown on the polysilicon film and on the silicon substrate exposed through the contact hole. The polysilicon film and the silicon layer constitute an information storage electrode. At least the silicon layer of the information storage electrode is electrically connected to a source or a drain region of a transfer transistor of the memory cell. A gate insulation film is formed on the surface of the silicon layer. A counter electrode is formed such that the counter electrode is embedded in the trench.

12 Claims, 18 Drawing Sheets

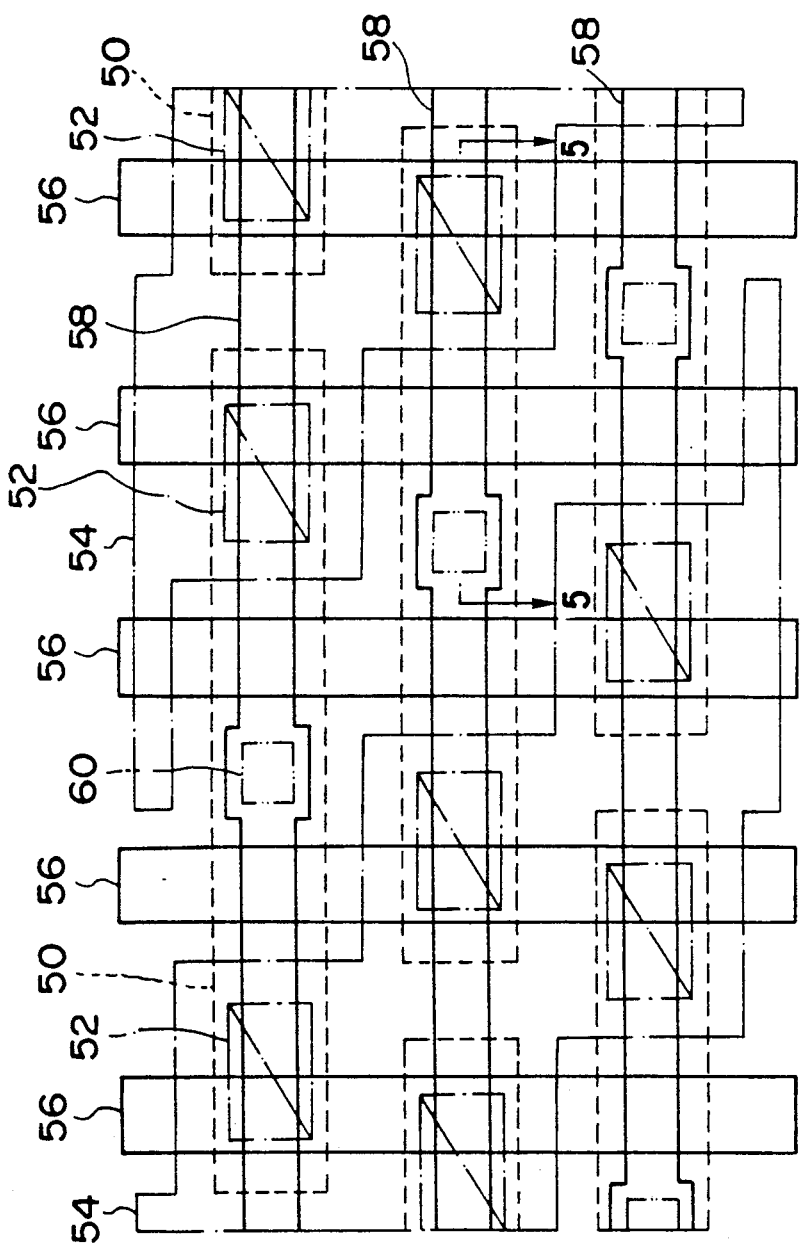

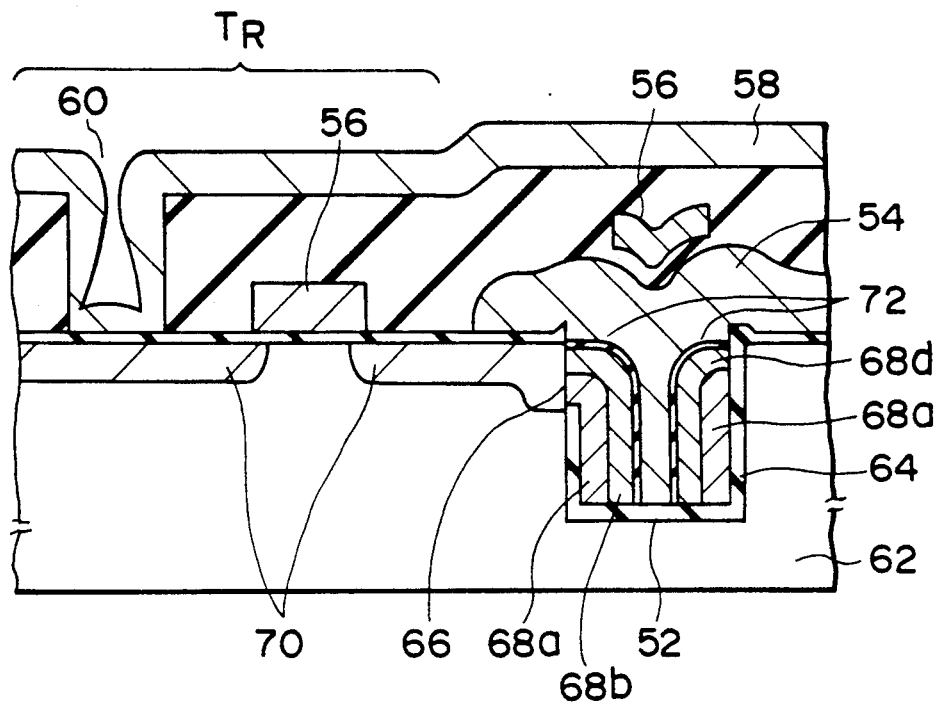
F I G. 5
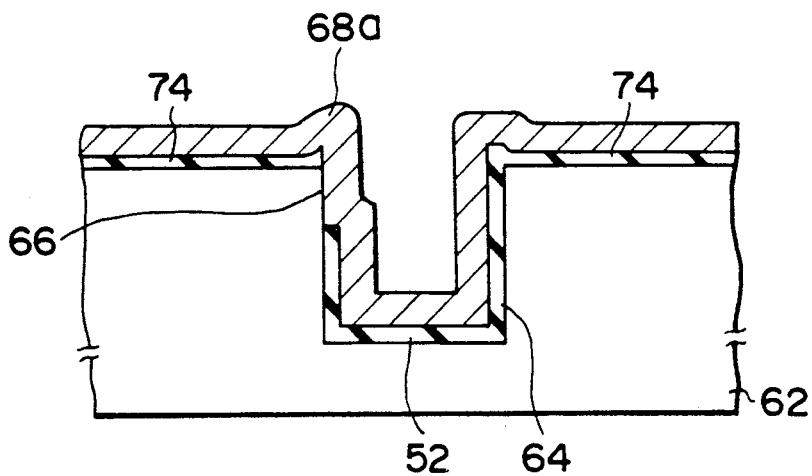
F I G. 6A

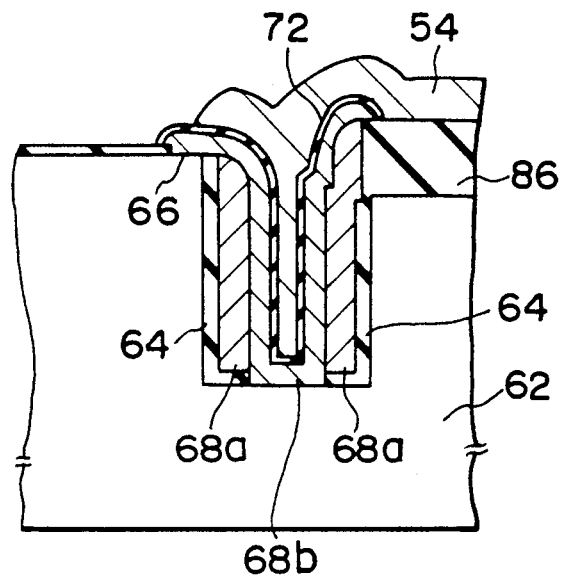
F I G. 13
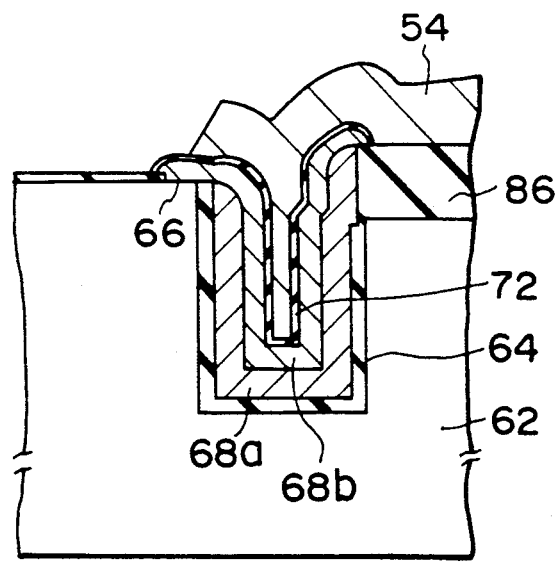
F I G. 14

CELL CAPACITOR OF A DYNAMIC RANDOM ACCESS MEMORY AND A METHOD OF MANUFACTURING THE SAME

Background of the Invention 1. Field of the Invention

The present invention relates to a structure of a cell capacitor of a one-transistor/one-capacitor type dynamic random access memory (DRAM), and to a method of manufacturing the same.

2. Description of the Related Art

In the technical field of one-transistor/ one-capacitor type DRAMs, various cell structures, which are advantageous in miniaturization for high integration have been proposed. For example, there is known a memory cell wherein a capacitor is formed in a fine trench or hole.

FIG. 1 is a cross section of such a conventional memory cell. A fine trench 10 is formed in a semiconductor substrate 12. An insulation film 14 is formed on the wall of the trench 10. The insulation film 14 is provided with a contact hole 16 in an upper region of the trench 10. A hollow-cylindrical information storage electrode 18 is formed on an inner side wall of the trench 10. The information storage electrode 18 is electrically connected to one of source and drain regions 20 of a transfer transistor TR. A gate insulation film 22 is formed on the inner wall of the information storage electrode 18. An opposed electrode (i.e. cell plate electrode) 24 is embedded in the trench 10.

Also proposed is a structure of a cell capacitor which is formed in a fine trench, as shown in FIG. 2. In FIG. 2, an insulation film 26 is formed on the inner wall of a trench 28 made in a semiconductor substrate 30. An insulation film 32 is formed on the semiconductor substrate 30. The insulation film 32 is provided with a contact hole 34 in a peripheral region of the trench 28. An information storage electrode 36 is formed so as to cover the insulation film 26 on the inner wall of the trench 28 and the contract hole 34. The information storage electrode 36 is electrically connected to a source or drain region 38 of a transfer transistor. A counter electrode 40 is formed over the information storage electrode 36 with a gate insulation film 42 being interposed. The opposed electrode 40 is embedded in the trench 28.

In the example shown in FIG. 1, since the information storage electrode 18 is formed in the trench 10 by self-alignment, the structure of FIG. 1 is advantageous for attaining high integration. However, in the example of FIG. 1, since the contact hole 16 is formed in the vertical direction, it is relatively difficult to form the contact hole 16 with precise dimensions. In contrast, in the example shown in FIG. 2, since the contact hole 34 is formed on the surface of the semiconductor substrate 30, the formation of the contact hole 34 is easy. However, in this case, it is necessary to pattern the information storage electrode 36 with a sufficient mask alignment allowance with respect to the contact hole 34. Thus, a distance between two adjacent information storage electrodes must be set to a value greater than a minimum processing dimensions, and, therefore, the structure shown in FIG. 2 is not advantageous for attaining miniaturization.

A method of manufacturing the memory capacitor in the memory cell shown in FIG. 1 will now be described with reference to cross sectional views shown in FIGS. 3A to 3F.

As shown in FIG. 3A, a thermal oxide film 44 is formed a major surface of the silicon semiconductor substrate 12, and an oxidation-resistant film 46 is deposited on the thermal oxide film 44. Thereafter, the oxidation-resistant film 46 and the thermal oxide film 44 are sequentially etched so as to have desired patterns, and a fine hole reaching the silicon semiconductor substrate 12 is formed.

Then, as shown in FIG. 3B, with the oxidation-resistant film 46 being used as a mask, the silicon substrate 12 is etched. Thus, the fine trench 10 is formed. The trench 10 is subjected to thermal oxidation, so that a silicon oxide film serving as the insulation film 14 is formed on the inner wall of the trench 10.

FIG. 3C shows that a resist 48 is deposited on the resulting structure and exposed with a desired pattern. The exposed resist 48 is developed to form a hole reaching a region of the side face of the trench 10. A part of the silicon oxide film 14 opening to the hole is removed by dilute hydrofluoric acid solution, so that the contact hole 16 is formed in the silicon oxide film 14.

FIG. 3D shows the state that the resist 48 and the oxidation-resistant film 46 are removed and an electrically conductive polysilicon film 18 is deposited on the resulting body.

In FIG. 3E, the polysilicon film 18 is anisotropically etched, so that a portion thereof may remain on the side wall of the trench 10 in a cylindrical shape. This remaining portion of the polysilicon film 18 serves as an information storage electrode. The information storage electrode 18 is electrically connected to one of the source and drain regions of the transfer transistor through the contact hole 16.

FIG. 3F shows that the gate insulation film 22 is formed on the polysilicon film 18. an electrically conductive polysilicon film is deposited on the entire surface of the resulting structure. The polysilicon film is etched with a desired pattern, that a counter electrode 28 is formed.

By the above process, the cell capacitor is formed. Then, a DRAM cell is formed by forming the source and drain regions of the transfer transistor by a conventional process.

In the above-described method of manufacturing the cell capacitor, the connection between the information storage electrode and the source or drain region of the transfer transistor is attained by coating the polysilicon film 18 serving as the information storage electrode on the silicon substrate 12 exposed through the contact hole 16. If the wafer is left in the atmospheric air before the coating of the polysilicon film 18, or if oxygen ($O_2$2) or vapor ($H_2O$) enters a furnace when the polysilicon film 18 is deposited by a CVD method or the like, a residual oxide film (natural oxide film) is formed in an interface between the polysilicon film 18 and the silicon substrate 12. Though the thickness of the residual oxide film is about 20 Å, the contact resistance between the information storage electrode and the source or drain region of the transfer transistor becomes higher and unstable.

As stated above, in the prior art, the information storage electrode is formed by coating the conductive polysilicon film 18. Thus, there is a disadvantage in which the contact resistance between the information storage electrode and the source or drain region of the transfer transistor becomes higher and unstable.

SUMMARY OF THE INVENTION

The object of the present invention is to provide a cell capacitor of a dynamic random access memory and a method of manufacturing the same, wherein a contact resistance between an information storage electrode and a source or a drain region of a transfer transistor is low and a variation in contact resistance is small.

In other words, according to one aspect of the present invention, there is provided a cell capacitor of a dynamic random access memory according to the present invention comprises: a semiconductor substrate; a trench formed in the semiconductor substrate; an insulation film formed on the inner surface of the trench; a semiconductor layer formed on the insulation film; an electrically conductive layer formed on the semiconductor layer and on the semiconductor substrate by epitaxial growth on at least the semiconductor substrate, the electrically conductive layer and the semiconductor layer constituting an information storage electrode of the cell capacitor; a gate insulation film formed on the electrically conductive layer; and a counter electrode formed on the gate insulation film, at least the information storage electrode, the gate insulation film and the counter electrode being embedded in the trench.

Also, according to another aspect of the present invention, there is provided a method of manufacturing a cell capacitor of a dynamic random access memory according to the present invention comprises the steps of: forming a trench in a semiconductor substrate; exposing a portion of the semiconductor substrate, which is located in a region on the side wall of the trench; forming a semiconductor layer on the side wall of the trench; causing an electrically conductive layer to be epitaxially and selectively grown on the semiconductor layer and on the exposed portion of the semiconductor substrate, and integrating the electrically conductive layer during the growth; forming a gate insulation film on the surface of the electrically conductive layer; and forming a counter electrode on the gate insulation film and within the trench.

Furthermore, according to still another aspect of the present invention, there is provided a method of manufacturing a cell capacitor of a dynamic random access memory according to the present invention comprises the steps of: forming a trench in a semiconductor substrate; forming an insulation film on the inner surface of the trench; forming a semiconductor layer on the side wall of the trench; exposing a portion of the semiconductor substrate, which is located in a region on an upper surface of the semiconductor substrate in the vicinity of the trench; causing an electrically conductive layer to be epitaxially and selectively grown on the semiconductor layer and on the exposed portion of the semiconductor substrate, and integrating the electrically conductive layer during the growth; forming a gate insulation film on the surface of the electrically conductive layer; and forming a counter electrode on the gate insulation film and within the trench.

BRIEF DESCRIPTION OF THE DRAWINGS

FIG. 4 shows an arrangement of memory cells in a DRAM including cell capacitors according to a first embodiment of the present invention;

FIG. 5 is a cross section taken along line A—A in FIG. 4;

FIGS. 6A to 6D are cross sections illustrating the steps of manufacturing the cell capacitor shown in FIG. 5;

FIG. 13 is a cross section showing a structure of a cell capacitor according to a sixth embodiment of the present invention;

FIG. 14 is a cross section showing a structure of a cell capacitor according to a seventh embodiment of the present invention.

DETAILED DESCRIPTION OF THE PREFERRED EMBODIMENTS

Figure 1:
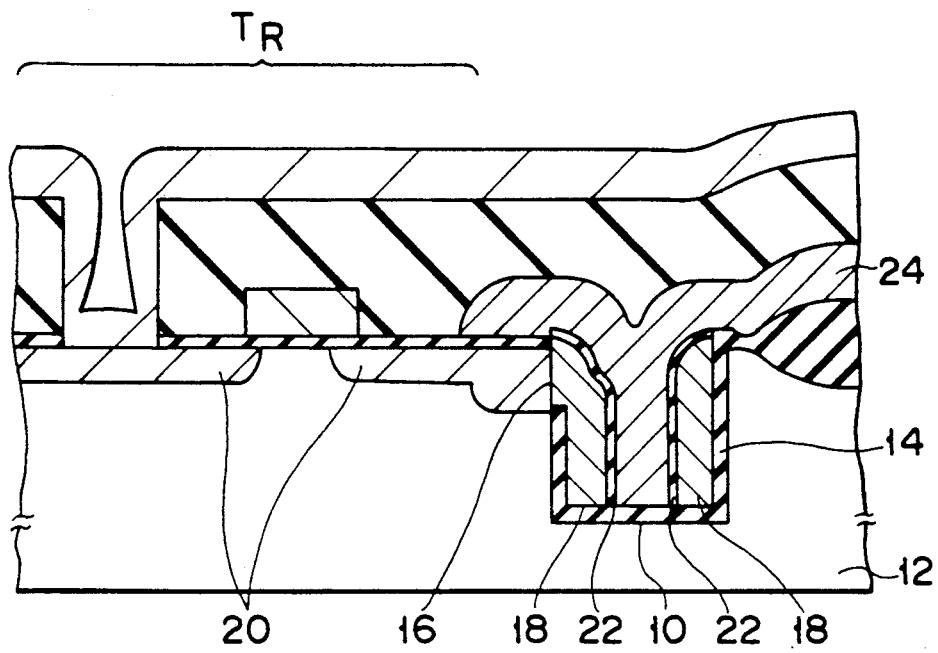
FIGS. 1 and 2 are cross sections showing cell capacitors of conventional DRAM cells.
Figure 2:
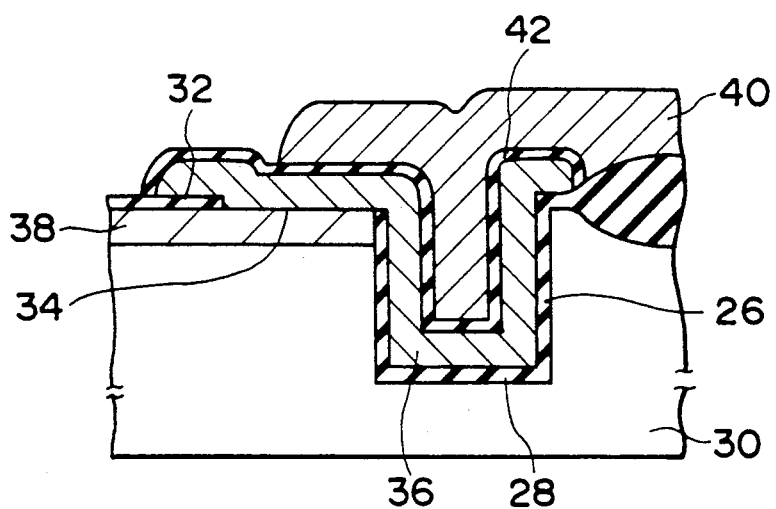

Embodiments of the present invention will now be described in detail with reference to the accompanying drawings.

FIG. 4 is a plan view showing an arrangement of memory cells in a DRAM according to a first embodiment of the present invention. In FIG. 4, each of element regions 50 includes two memory cells each constituted by one transistor and one capacitor. The capacitor of each memory cell comprises a information storage electrode (not shown) and a gate insulation film (not shown) formed in a trench 50, and a counter electrode (i.e. cell plate electrode) 54 which obliquely extends over the element region 50. The counter electrode 54 serves as a common electrode for each memory. Word lines 56 serves as a gate electrode for each transfer transistor. Bit lines 58 are connected to the element regions 50 through contact holes 60.

FIG. 5 is a cross section taken along line A—A in FIG. 4. FIG. 5 shows one of the memory cells. In this memory cell, an insulation film 64 is formed on the wall of a fine trench 52 made in a silicon substrate 62. A contact hole 66 is formed in a portion of the insulation film 64, such that the contact hole 66 reaches a region of the side wall of the trench 52. A hollow-cylindrical polysilicon film 68a is formed along the side wall of the trench 52. A silicon layer 68b is epitaxially and selectively grown on the polysilicon film 68a and that portion of the silicon substrate 62 which is exposed through the contact hole 66. These polysilicon film 68a and silicon layer 68b constitute an information storage electrode. At least the silicon layer 68b of the information storage electrode is electrically connected to one of the source and drain regions 70 of a transfer transistor $T_R$. It may be possible to connect only the silicon layer 68b to the source or drain region 70. A gate insulation film 72 is formed on the surface of the silicon layer 68b. A counter electrode 54 is embedded in the trench 52.

A method of manufacturing the cell capacitor in the DRAM shown in FIG. 5 will now be described with reference to cross sections of FIGS. 6A to 6D. In these figures, the structural elements already shown in FIG. 5 are indicated by the same reference numerals.

Figure 3A:
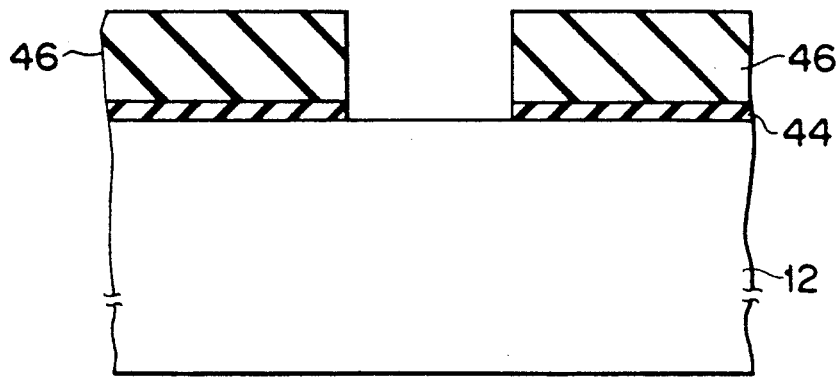
FIGS. 3A to 3F are cross sections illustrating the steps of manufacturing the cell capacitor shown in FIG. 1.
Figure 3B:
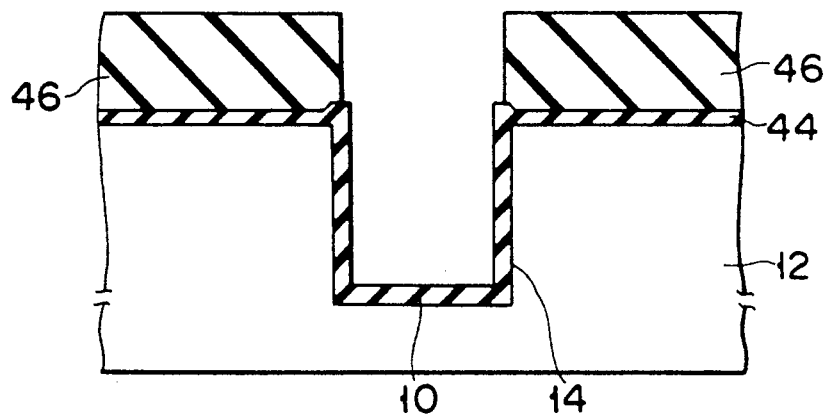
Figure 3C:
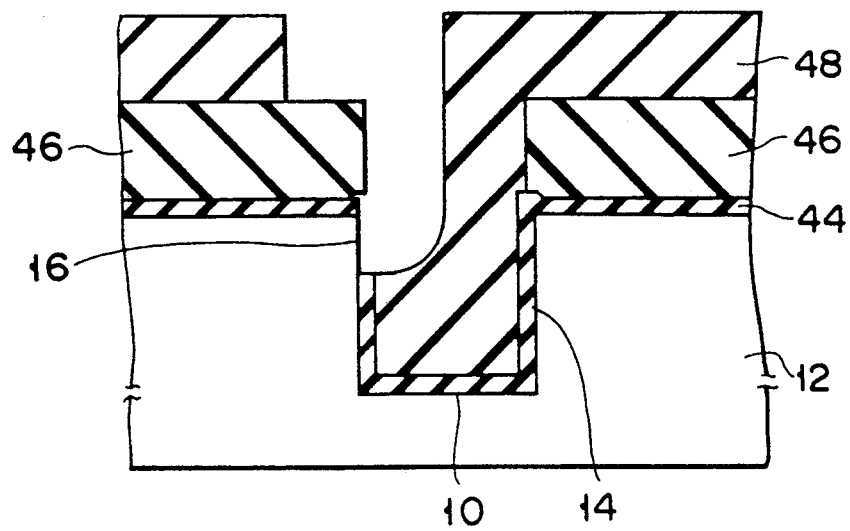
Figure 3D:
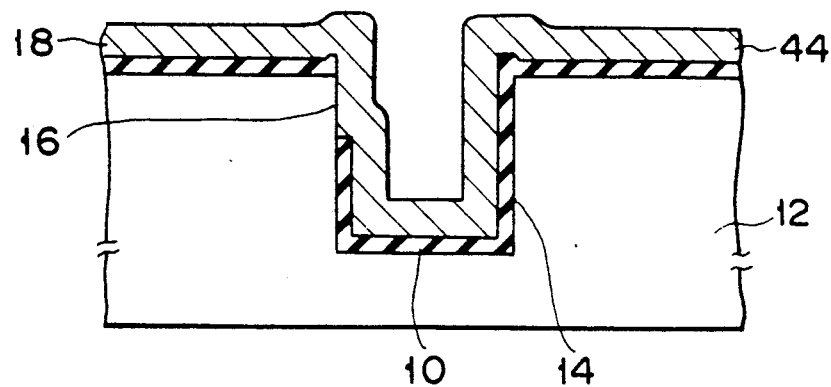
Figure 3E:
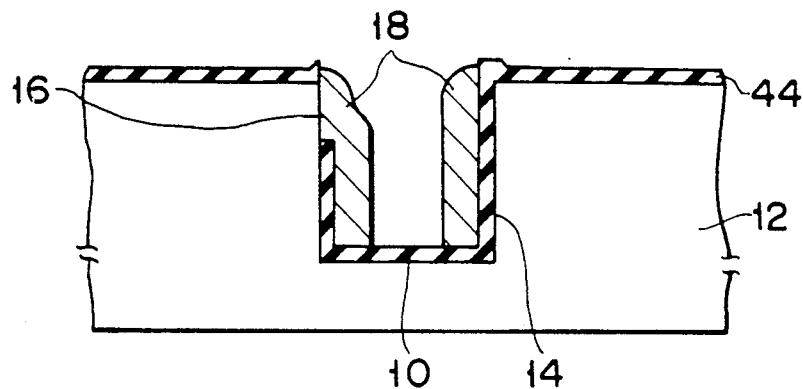
Figure 3F:
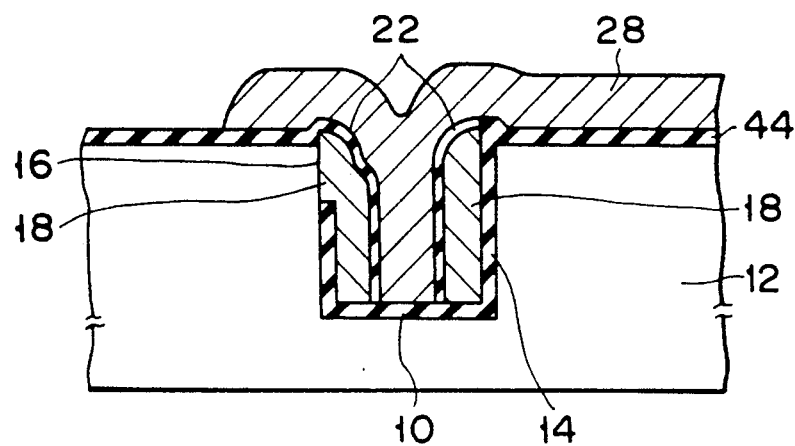

Like in the above-described conventional method shown in FIG. 3A and FIG. 3B, a thermal oxide film 74 is formed on the surface of the silicon substrate 62, and the fine trench 52 is formed. A silicon oxide film serving as the insulation film 64 is formed on the inner wall of the trench 52. Also, as in the conventional method shown in FIG. 3C, the contact hole 66 is formed in a portion of the silicon oxide film 64 formed on the inner wall of the trench 52. Then, as shown in FIG. 6A, an electrically conductive polysilicon film 68a is deposited on the entire surface of the resulting structure. The polysilicon film 68a is not necessary provided with an electrically conductivity.

Figure 6B:
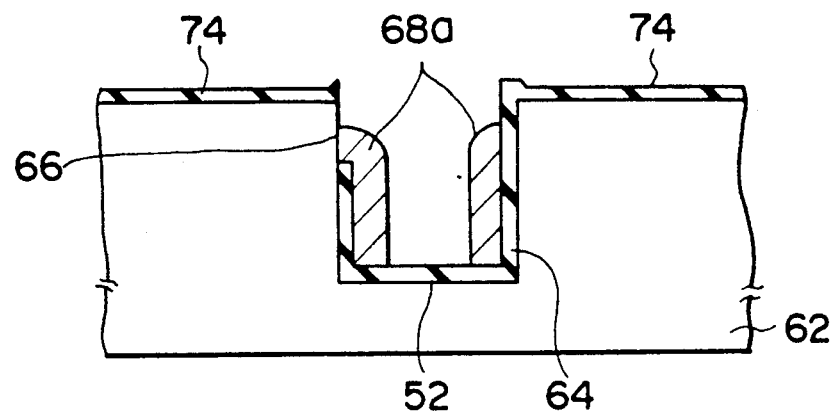

Then, as shown in FIG. 6B, the polysilicon film 68a is anisotropically etched, and a hollow-cylindrical portion thereof is left on the side wall of the trench 52. In this case, the polysilicon film 68a is etched such that the silicon substrate 62 is entirely or partially exposed through the contact hole 66.

Figure 6C:
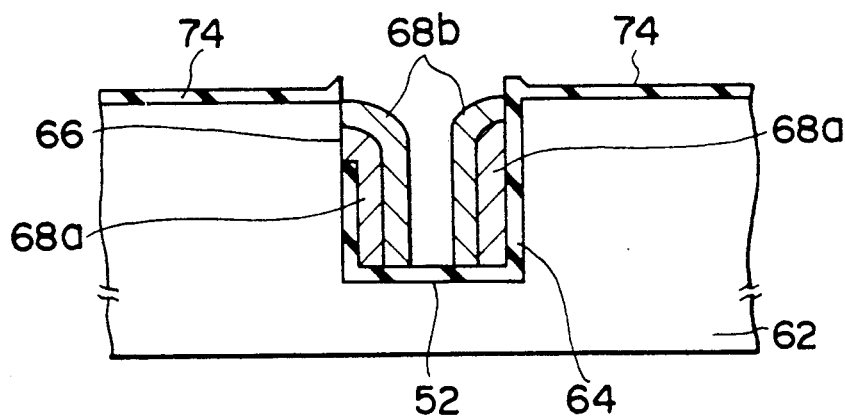

FIG. 6C shows the state that the silicon layer 68b is epitaxially and selectively grown. The silicon layer 68b is epitaxially grown only on the surface of the polysilicon film 68a and on the exposed region of the silicon substrate 62.

Figure 6D:
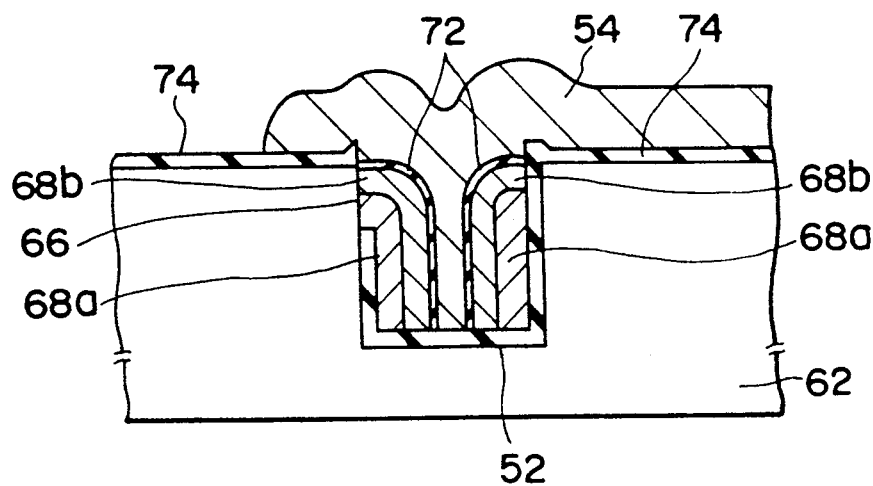

As shown in FIG. 6D, after the gate insulation film 72 is formed on the silicon layer 68b, an electrically conductive polysilicon film is deposited. The polysilicon film is patterned and the counter electrode 54 is formed. Thus, the manufacture of the cell capacitor is completed. Thereafter, if the transfer transistor is formed, the memory cell can be obtained.

According to the cell capacitor and the method of manufacturing the same, the information storage electrode is formed by the silicon layer 68b which is epitaxially grown on that portion of the silicon substrate 62 which is exposed through the contact hole 66 and on the polysilicon film 68a. In other words, there is no concern that a natural oxide film is formed in an interface between the information storage electrode and the silicon substrate 62. Thus, the contact resistance between the information storage electrode and the source or drain region 70 of the transfer transistor TR can be made lower and stable.

FIGS. 7A to 7E are cross sections illustrating a second embodiment of the present invention, wherein this invention is applied to a cell capacitor in which a contact hole is formed on the surface of a substrate. In FIGS. 7A to 7E, the structural elements already shown in FIGS. 6A to 6D are indicated by the same reference numerals.

Like in the conventional method, the thermal oxide film 74 is formed on the surface of the silicon substrate 62, and then the fine trench 52 is formed. The silicon oxide film 64 is formed on the inner wall of the trench 52.

Figure 7A:
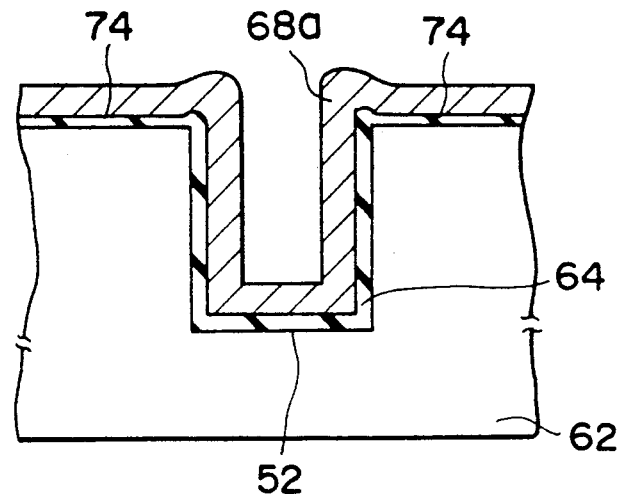
FIGS. 7A to 7E are cross sections illustrating the steps of manufacturing a cell capacitor according to a second embodiment of the present invention.
Figure 7B:
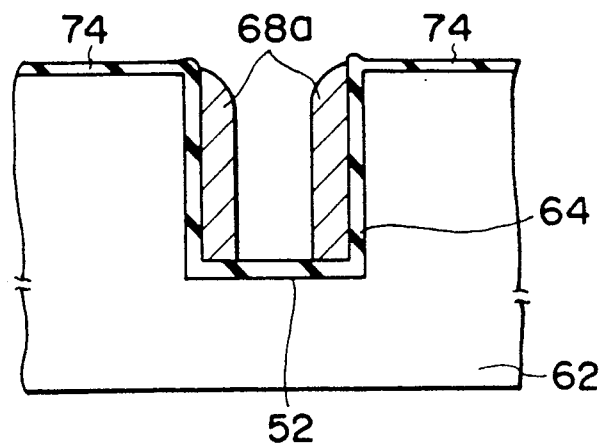

As shown in FIG. 7A, the electrically conductive polysilicon film 68a is deposited on the entire surface of the resulting structure. Then, as shown in FIG. 7B, the polysilicon film 68a is anisotropically etched and a hollow-cylindrical portion thereof is made to remain on the side wall of the trench 52. It is desirable that the polysilicon film 68a remain up to the upper edge of the trench 52.

Figure 7C:
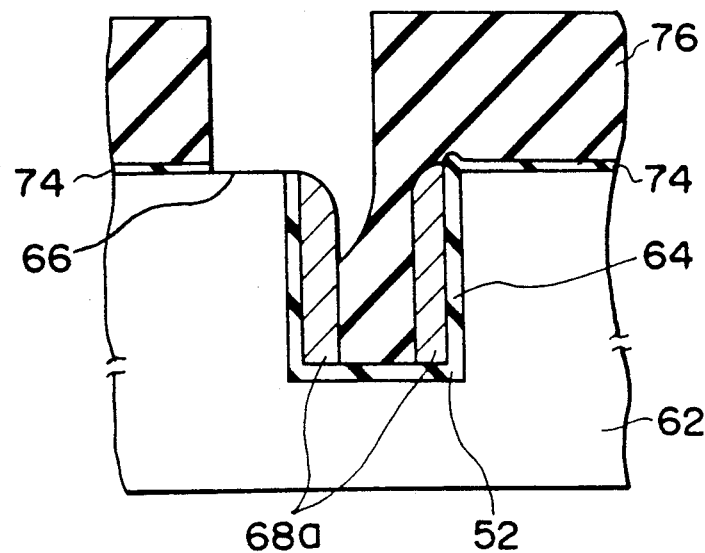

Thereafter, as shown in FIG. 7C, a resist 76 is deposited over the entirely surface of the resulting structure, and the resist 76 is exposed with a desired pattern. With the patterned resist 76 being used as a mask, the thermal oxide film 74 is etched to expose the silicon substrate 62 and form the contact hole 66.

Figure 7D:
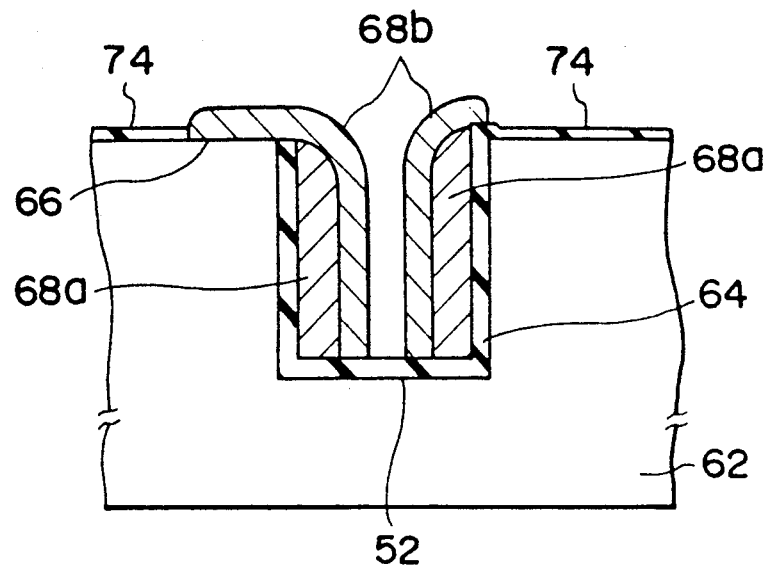

In FIG. 7D, the resist 76 is removed, and the silicon layer 68b is epitaxially and selectively grown on the surface of the polysilicon film 68a and the exposed surface of the silicon substrate 62. In this case, the silicon layer 68b is grown separately on the polysilicon film 68a and on the silicon substrate 62. However, since the polysilicon film 68a remains up to the upper edge of the trench 52, the silicon layer 68b is integrated during the growth.

Figure 7E:
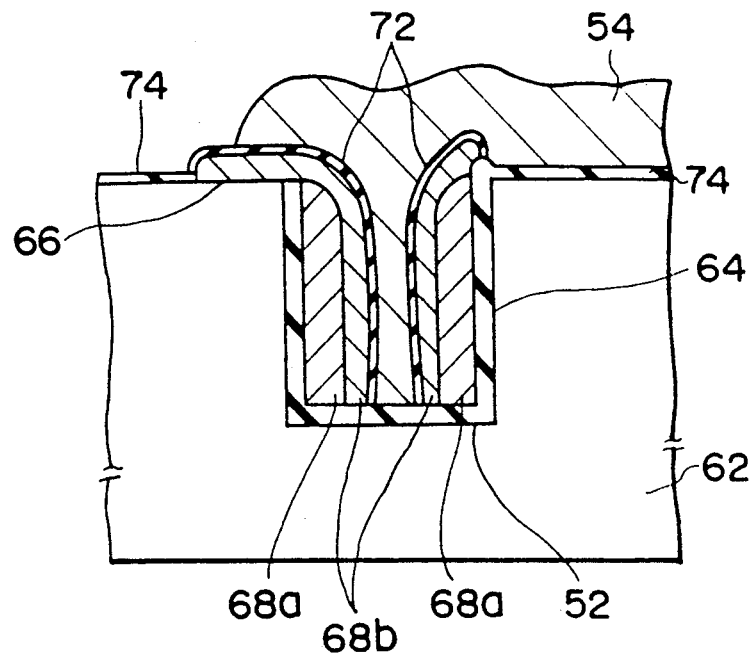

In FIG. 7E, after the gate insulation film 72 is formed on the silicon layer 68b, an electrically conductive polysilicon film is deposited on the resulting structure. The polysilicon film is patterned to form the counter electrode 54. Thus, the formation of the cell capacitor is completed.

By this method of manufacturing the cell capacitor, the same advantages as in the first embodiment shown in FIGS. 6A to 6D can be obtained. Since the information storage electrode can be self-aligned with respect to the contact hole 66 and the trench 52, the manufacturing steps can be simplified, and the miniaturization of the memory cell can be attained.

FIGS. 8A to 8I are cross sections illustrating a third embodiment of the present invention, wherein this invention is applied to a cell capacitor in which a contact hole is formed by self-alignment. In FIGS. 8A to 8I, the structural elements already shown in FIGS. 7A to 7E are indicated by the same reference numerals.

Figure 8A:
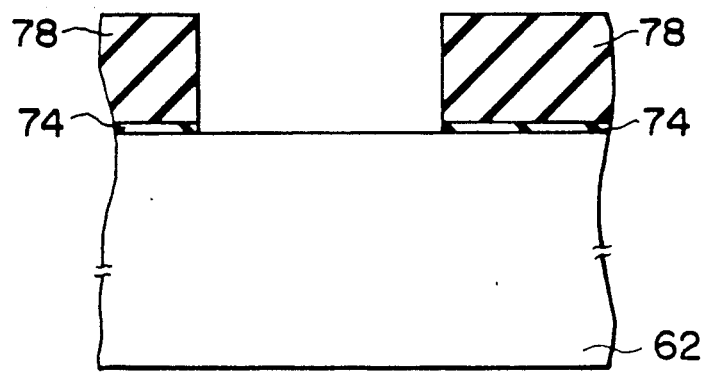
FIGS. 8A to 8I are cross sections illustrating the steps of manufacturing a cell capacitor according to a third embodiment of the present invention.

As shown in FIG. 8A, the thermal oxide film 74 is formed on a major surface of the silicon substrate 62, and a first oxidation-resistant film 78 is formed on the thermal oxide film 74. Then, the first oxidation-resistant film 78 and the thermal oxide film 74 are sequentially etched with a desired pattern.

Figure 8B:
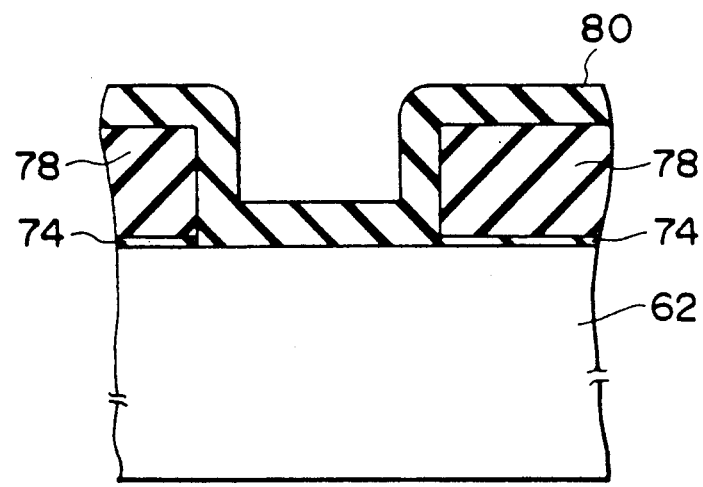
Figure 8C:
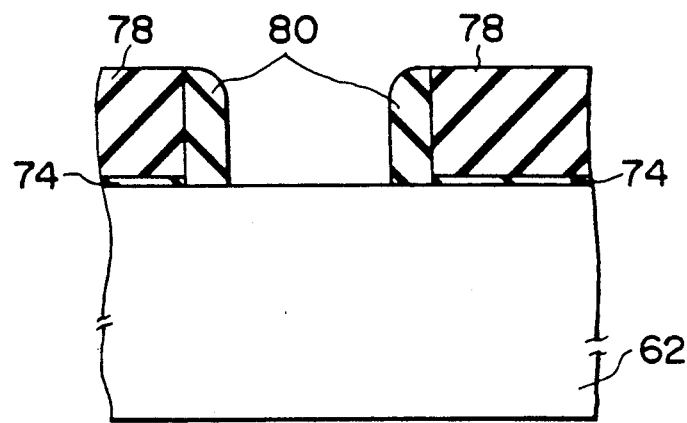
Figure 8D:
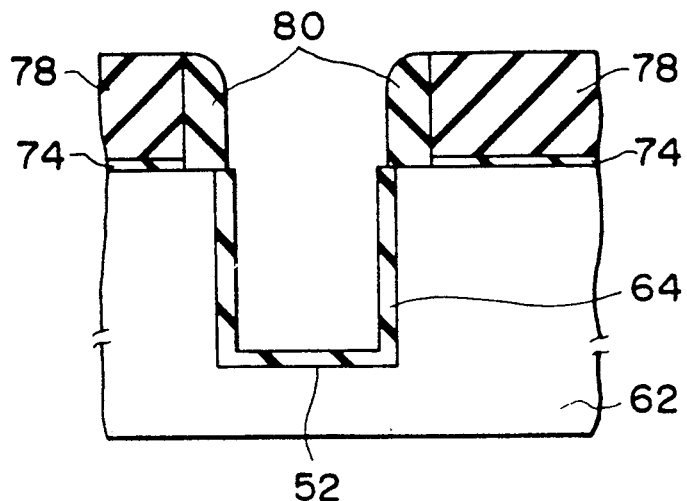

Then, as shown in FIG. 8B, a second oxidation-resistant film 80 is deposited on the entire surface of the resulting structure. The second oxidation-resistant film 80 is anisotropically etched, as shown in FIG. 8C, and the film 80 is made to remain only on the side wall of the first oxidation-resistant film 78. By using the first and second oxidation-resistant films 78 and 80 as a mask, as shown in FIG. 8D, the silicon substrate 62 is etched to form the fine trench 52. Thereafter, the trench 52 is subjected to thermal oxidation, so that the silicon oxide film 64 is formed on the inner wall of the trench 52.

Figure 8E:
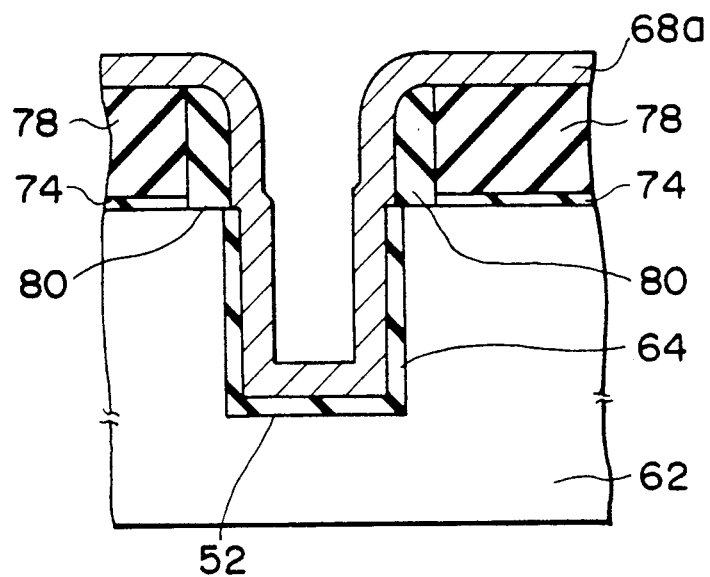
Figure 8F:
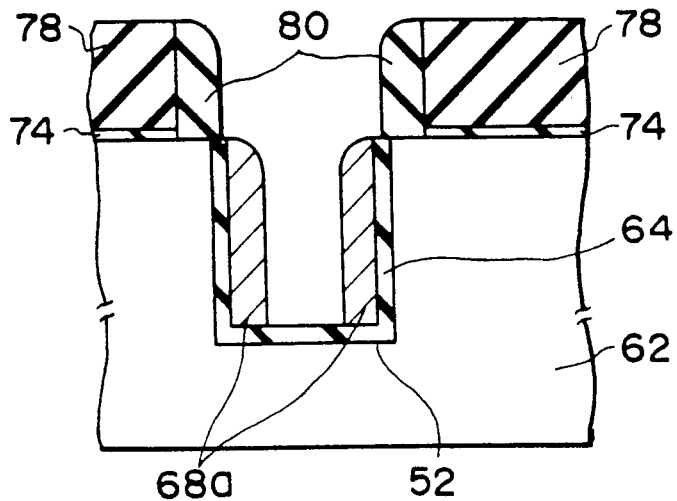
Figure 8G:
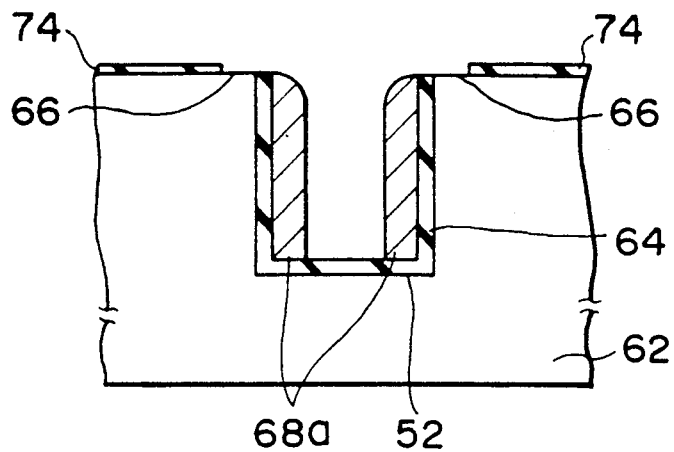

In FIG. 8E, the polysilicon film 68a is deposited on the entire surface of the resulting structure. In FIG. 8F, the polysilicon film 68a is anisotropically etched to make a cylindrical portion thereof remain on the side wall of the trench 52. It is desirable that the polysilicon film 68a remain up to the upper edge of the trench 52. In FIG. 8G, the first and second oxidation-resistant films 78 and 80 are removed, so that the contact hole 66 is formed in a peripheral region of the trench 52.

Figure 8H:
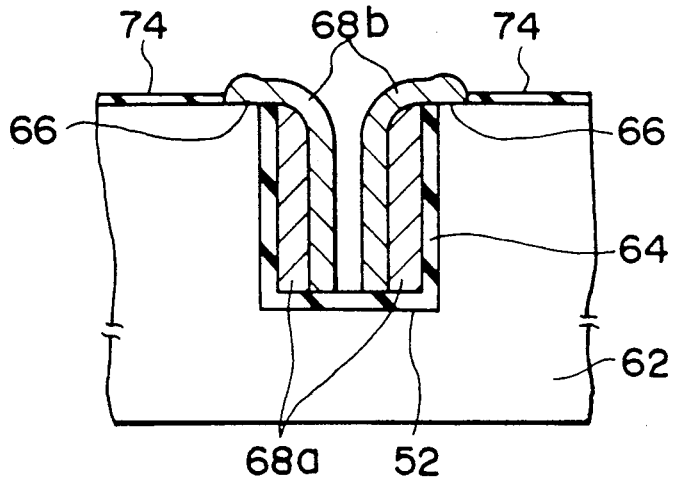

Thereafter, as shown in FIG. 8H, the silicon layer 68b is epitaxially and selectively grown on the polysilicon film 68a and on that portion of the silicon substrate 62 which is exposed through the contact hole 66. In this case, the silicon layer 68b is grown separately on the polysilicon film 68a and on the exposed surface of the silicon substrate 62. However, since the polysilicon film 68a remains up to the upper edge of the trench 52, the silicon layer 68b is integrated during the growth.

Figure 8I:
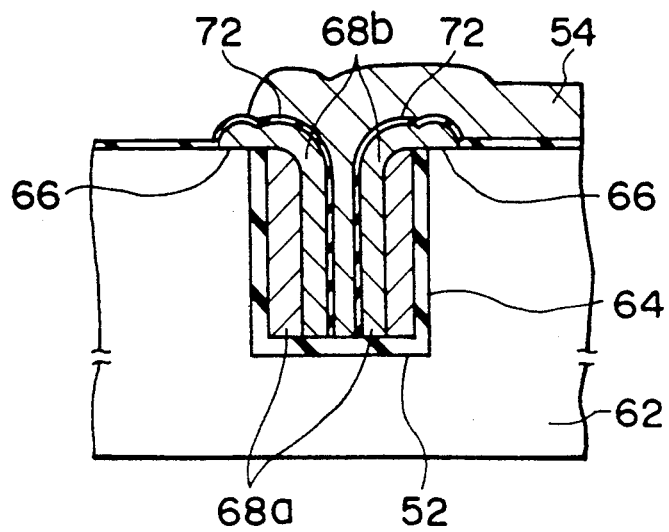

In FIG. 8I, the gate insulation film 72 is formed on the silicon layer 68b, an electrically conductive polysilicon film is deposited. The polysilicon film is patterned to form the counter electrode 54, and the formation of the cell capacitor is completed.

According to this method, the same advantages as in the second embodiment shown in FIGS. 7A to 7E can be obtained, and the contact hole 66 can be formed without a photo-lithography step. Thus, the resist is not embedded in the fine trench 52, or the resist does not remain in the trench 52. In addition, the trench 52 is not contaminated by the resist.

In the method shown in FIGS. 8A to 8I, the storage electrode and the contact hole are self-aligned with respect to the trench, and the contact hole is formed over the entire peripheral region of the opening of the trench. In the present invention, the contact hole may be formed at a portion of the peripheral region of the opening of the trench. In this case, the contact may be formed in two methods described hereinafter.

A first method will be described with reference to FIGS. 9A to 9I. FIGS. 9A to 9I are cross sections illustrating the steps of the first method. FIGS. 10A to 10C are plan views corresponding to FIGS. 9A, 9B and 9G. In these figures, the structural elements already shown are indicated by the same reference numerals.

The element region 50 is formed on the semiconductor substrate 62. After the thermal oxide film 74 is formed on the element region 50, the first oxidation-resistant film 78 is deposited. The first oxidation-resistant film 78 may be made, for example, silicon nitride ($Si_3N_4$). The oxidation-resistant film 78 is deposited by an LPCVD method.

Figure 9A:
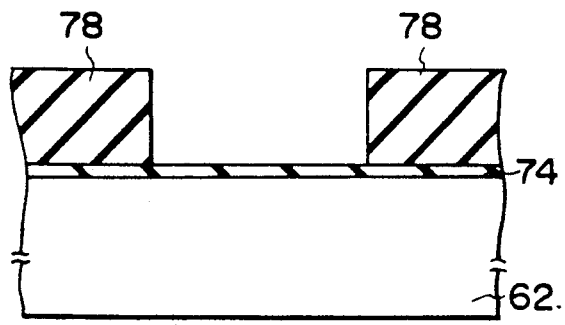
FIGS. 9A to 9I are cross sections illustrating the steps of manufacturing a cell capacitor according to a fourth embodiment of the present invention.
Figure 10A:
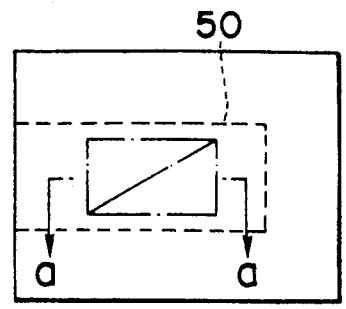
FIGS. 10A to 10C are plan views of FIGS. 9A, 9B and 9G.
Figure 10B:
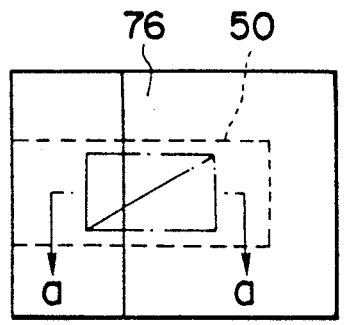
Figure 10C:
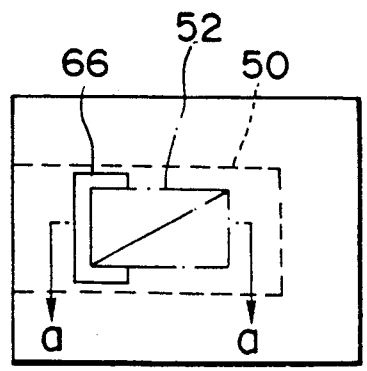

In FIG. 9A, an opening reaching the thermal oxide film 74 is formed in a desired region of the oxidation-resistant film 78. FIG. 10A is a plan view corresponding to the state shown in FIG. 9A. Namely, FIG. 9A is a cross section taken along line a-a in FIG. 10A.

Figure 9B:
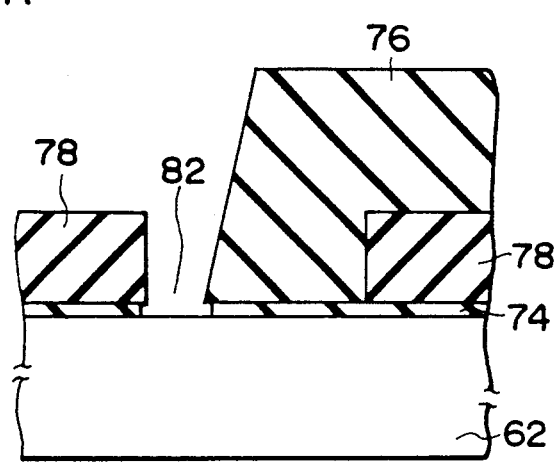

After the resist 76 is deposited on the entire surface of the resulting body, the resist 76 is patterned such that an area 82 corresponding to a portion of the opening is exposed, as shown in FIG. 9B and FIG. 10B. The exposed area 82 includes a region which will serve as the contact hole. That portion of the thermal oxide film 74, which opens to the area 82, is removed by etching, with the pattern of the resist 76 being used as a mask. Thus, the surface of the silicon substrate 62 is exposed.

Figure 9C:
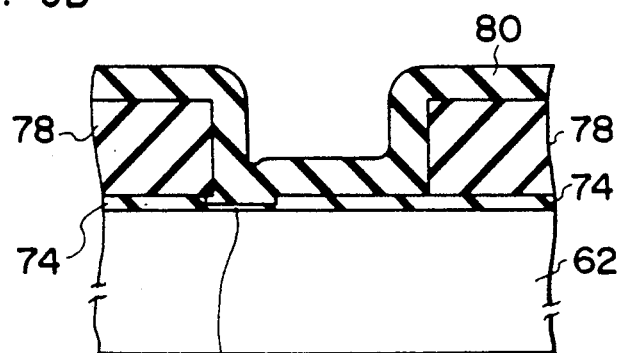

Then, the resist 76 is removed, and the resulting structure is subjected to thermal oxidation. The thermal oxide film 84 is thus formed in the area 82, as shown in FIG. 9C. In the step of thermal oxidation, the thermal oxide film 74 is also grown, but the thickness of the thermal oxide film 84 is obviously smaller than that of the thermal oxide film 74. By utilizing the difference in thickness between the thermal oxide films 74 and 84, the contact hole can be formed only in a part of the peripheral region of the trench. After the thermal oxide film 84 is formed, the second oxidation-resistant film 80 is deposited.

Figure 9D:
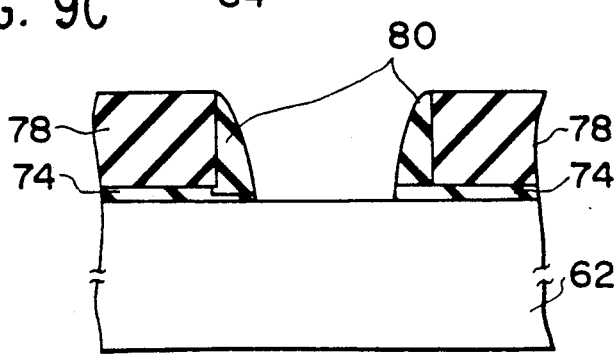
Figure 9E:
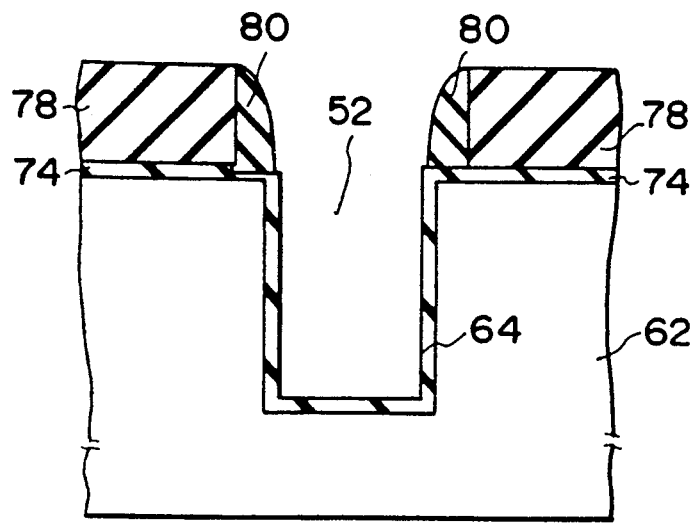
Figure 9F:
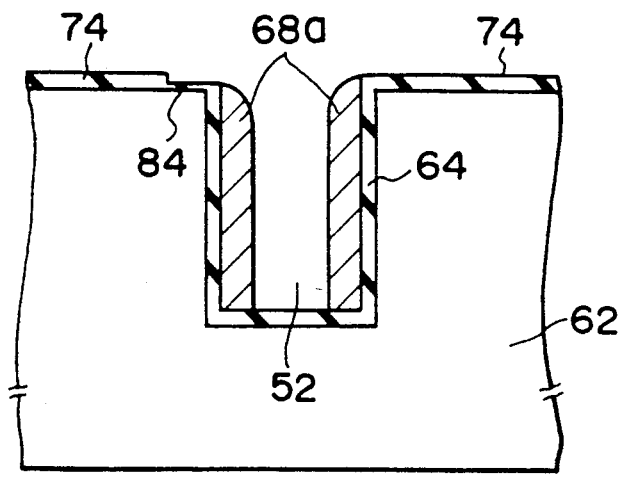

In FIG. 9D, the second oxidation-resistant film 80 is anisotropically etched to make a portion thereof remain only on the side wall of the first oxidation-resistant film 78. Then, as shown in FIG. 9E, by using the first and second oxidation-resistant films 78 and 80 as a mask, the silicon substrate 62 is anisotropically etched to form the fine trench 52 therein. The resulting structure is subjected to thermal oxidation, thereby to form the silicon oxide film 64 on the inner wall of the trench 52.

Figure 9G:
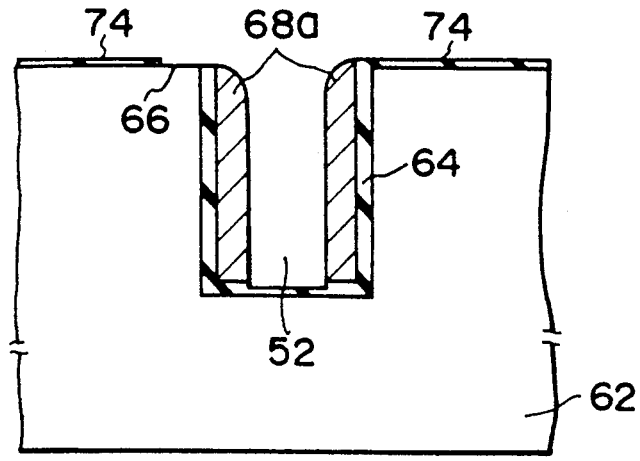

After the first and second oxidation-resistant films 78 and 80 are removed, the electrically conductive polysilicon film 68a is deposited on the entire surface of the resulting body. The polysilicon film 68a is anisotropically etched so that a portion of the polysilicon film 68a is left on the side wall of the trench 52 in a hollow-cylindrical shape. The thermal oxidation film 84 is then removed, as shown in FIG. 9G. In this case, the etching condition is selected, so that the thermal oxide film 74 may remain. Only if this condition is met, the type of etching is not questioned, for example, isotropic etching or anisotropic etching. If the thermal oxide film 84 is removed in this manner, the contact hole 66 is formed along a portion of the peripheral region of the trench 52 by a self-aligning process, as shown in FIG. 10C.

Figure 9H:
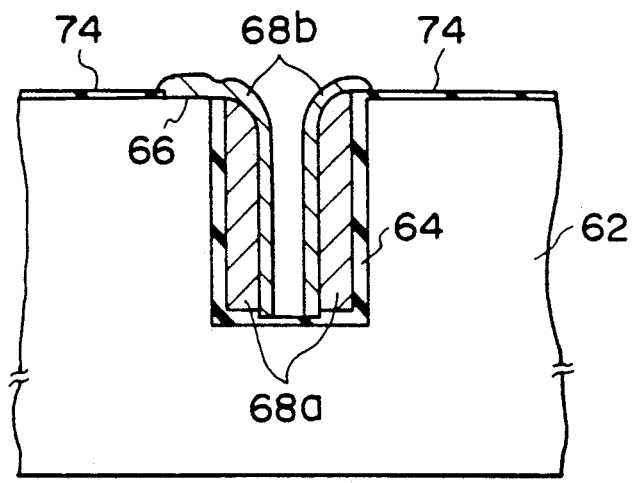

In FIG. 9H, the silicon layer 68b is epitaxially and selectively grown on the surface of the polysilicon film 68a and on that portion of the silicon substrate 62 which is exposed through the contact hole 66. In this case, the silicon layer 68b is grown separately on the polysilicon film 68a and on the exposed portion of the silicon substrate 62. Since the polysilicon film 68a is left up to the upper edge of the trench 52, the silicon layer 68b is integrated while it grows.

Figure 9I:
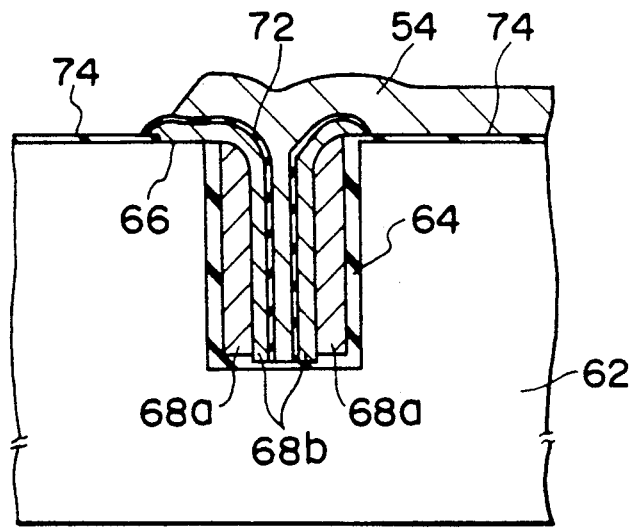

In FIG. 9I, after the gate insulation film 72 is formed on the silicon layer 68b, an electrically conductive polysilicon film is deposited. This polysilicon film is patterned to form the counter electrode 54. Thus, the formation of the cell capacitor is completed.

In this fourth embodiment, in the step shown in FIG. 9B, the thermal oxide film 74 is selectively etched and removed, so that the silicon substrate 62 is exposed. It is, however, possible to etch the thermal oxide film 74 to a desired thickness and leave the film 74, without completely removing the film 74. In this case, immediately after the resist 76 is removed, the oxidation-resistant film 80 is deposited.

Figure 11A:
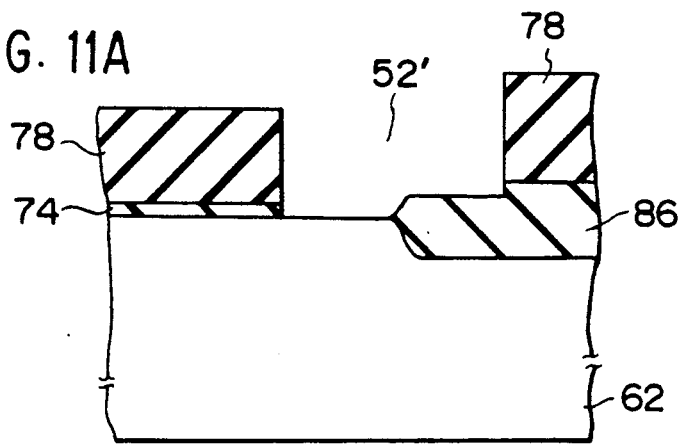
FIGS. 11A to 11F are cross sections illustrating the steps of manufacturing a cell capacitor according to a fifth embodiment of the present invention.
Figure 12A:
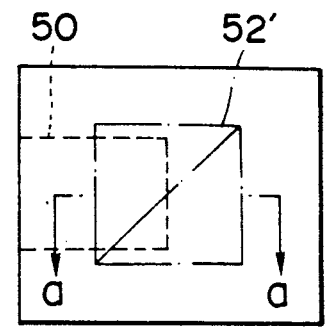
FIGS. 12A and 12B are plan views of FIGS. 11A and 11E.
Figure 11B:
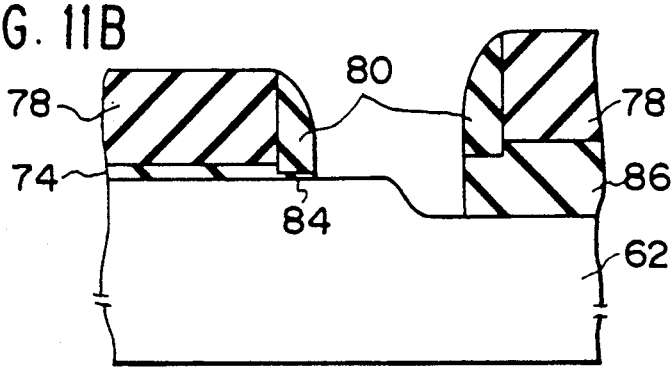
Figure 11C:
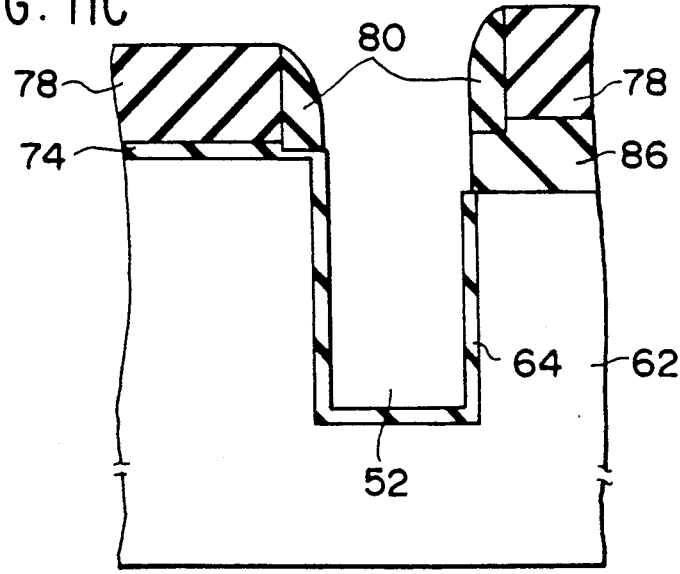
Figure 11D:
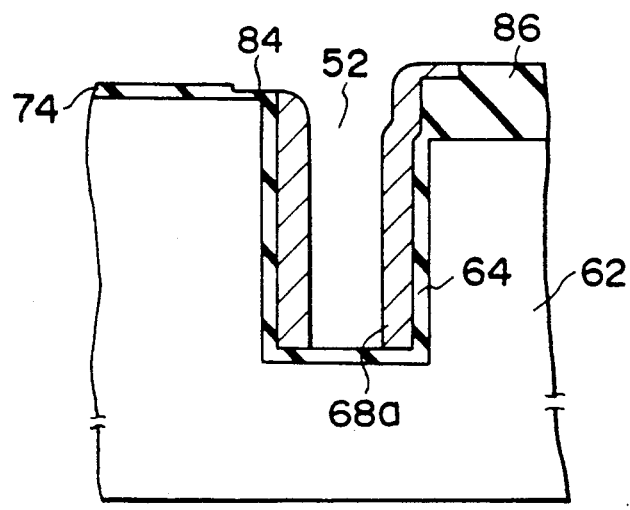
Figure 11E:
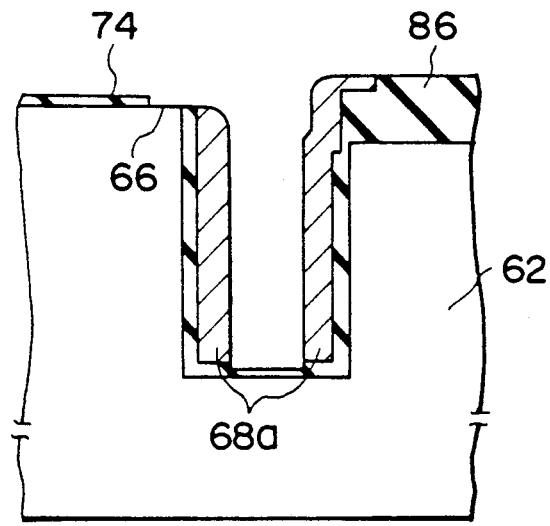
Figure 12B:
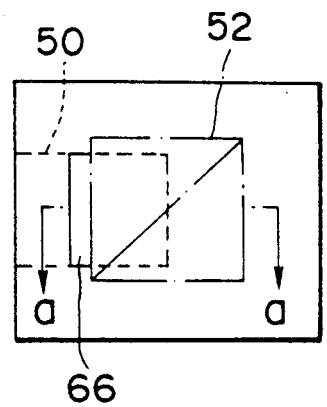

A second method of forming the contact hole will now be described, as a fifth embodiment, with reference to the cross sections of FIGS. 11A to 11F and the plan views of FIGS. 12A and 12B. In the fifth embodiment, a portion of the trench is made to extend to a thick insulation film for separating elements, so that the contact hole is formed in a self-aligning manner in the trench and the element region. This basic idea of the second method is equal to that of the first method. In FIGS. 11A to 11F and FIGS. 12A and 12B, the structural elements already shown in the preceding figures are indicated by the same reference numerals.

The element region 50 is formed on the silicon substrate 62. In this fifth embodiment, the element region 50 is formed by a LOCOS (local oxidation of silicon) method. Then, the semiconductor substrate 62 is subjected to thermal oxidation to form the thermal oxide film 74 on the element region 50. Thereafter, the first oxidation-resistant film 78 is deposited. As shown in FIG. 11A, that portion of the first oxidation-resistant film 78, which is located in an area 52' where the fine trench is to be formed, is removed. In FIG. 11A, the underlying thermal oxide film 74 is also removed by etching. However, this underlying thermal oxide film 74 may be left. The area 52' extends over a field oxide film 86 and the element region 50, as shown in FIG. 12A.

The thermal oxide film 84 is formed on the exposed surface of the silicon substrate 62. After the thermal oxide film 84 is formed, the second oxidation-resistant film 80 is deposited and anisotropically etched. The second oxidation-resistant film 80 is left only on the side wall of the first oxidation-resistant film 78, as shown in FIG. 11B. The oxide film 84 is not necessarily provided. Then, as shown in FIG. 11C, by using the first and second oxidation-resistant films 78 and 80 as a mask, the silicon substrate 62 is anisotropically etched, and the fine trench 52 is formed therein. Thereafter, the trench 52 is subjected to thermal oxidation, so that the silicon oxide film 64 is formed on the inner wall of the trench 52.

After the first and second oxidation-resistant films 78 and 80 are removed, the electrically conductive polysilicon film 68a is deposited on the entire surface of the resulting body. The polysilicon film 68a is anisotropically etched and is left only on the side wall of the trench 52 in a hollow-cylindrical shape, as shown in FIG. 11D. In FIG. 11E, all of the oxide films 64, 74, 84 and 86 are etched to form the contract hole 66. The silicon substrate 62 is exposed through the contact hole 66. FIG. 12B is a plan view showing the state in FIG. 11E.

Figure 11F:
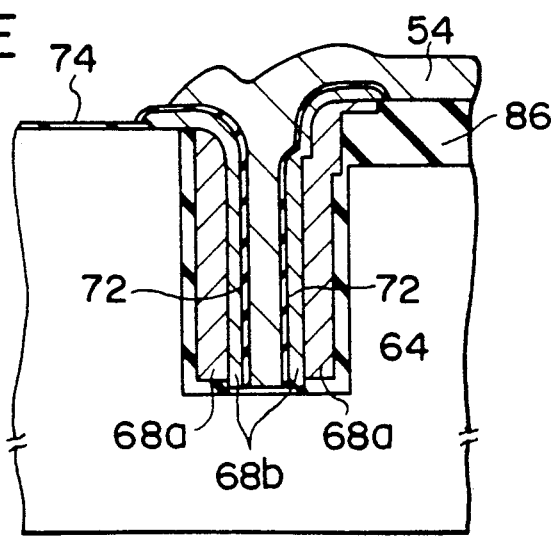

In FIG. 11F, the silicon layer 68b is epitaxially and selectively grown on that portion of the silicon substrate 62, which is exposed through the contact hole 66, and on the polysilicon film 68a remaining on the side wall of the trench 52. After the gate insulation film 72 is formed on the silicon layer 68b, the counter electrode 54 is formed, and the formation of the cell capacitor is completed.

The contact hole 66 formed by the above-described second method is self-aligned with respect to the element region 50 and the trench 52, as shown in FIG. 12B.

FIGS. 13 and 14 are cross sections showing structures of cell capacitors according to sixth and seventh embodiments. The structural elements already shown in the preceding figures are indicated by the same reference numerals. In these capacitors, the shapes of the oxide film 64 and silicon layers 68a and 68b formed in the trench are different from those shown in the other embodiments. These capacitors are formed by the second method (i.e., the trench extends to a portion of the field oxide film). However, these capacitors may be formed by using the methods of the other embodiments.

In FIG. 13, that portion of the oxide film 64 formed on the inner surface of the trench, which is located on the bottom of the trench, is removed. This portion of the oxide film 64 is removed when the contact hole 66 is formed.

In FIG. 14, the silicon layer 68a embedded in the trench is left both on the side wall of the trench and on the bottom face of the trench. The silicon layer 68a can be left on the side wall and bottom of the trench by making the resist remain only in the trench after the silicon layer 68a is deposited (i.e., after the resist is coated, the entire structure is exposed and developed). Then, the above-described steps are repeated, and the capacitor is formed.

In the above-described embodiments, the present invention has been applied to the cases where the cell capacitors are embedded in the fine trenches (holes). However, this invention is applicable to the formation of a cell capacitor formed a fine trench (groove), for example, an IVEC (Isolation-merged Vertical Capacitor) cell (described in IEDM Technical Digest, 1984, p. 240).

Figure 15A:
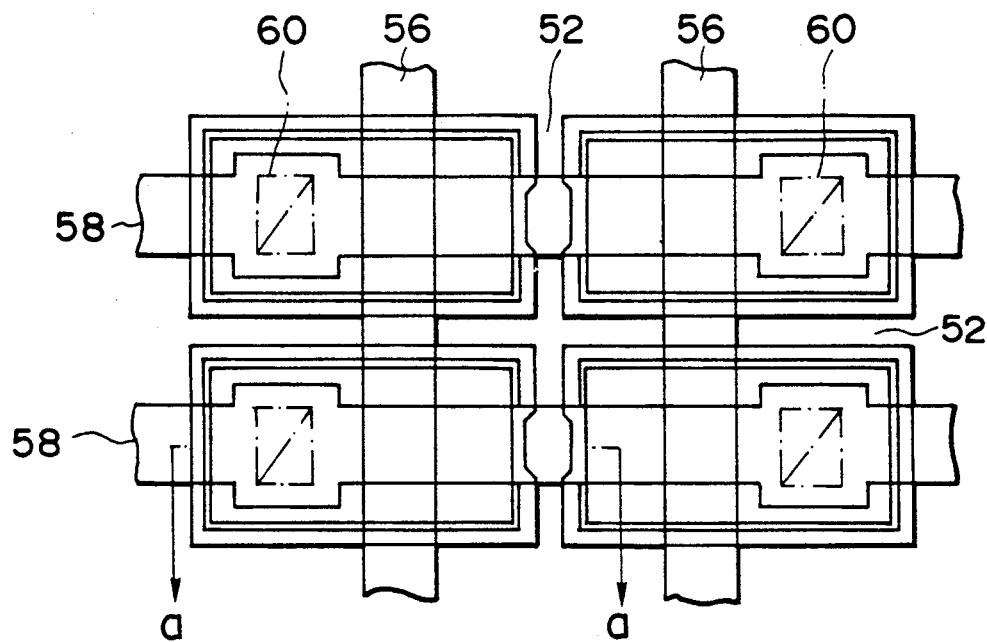
FIGS. 15A and 15B are, respectively, a plan view and a cross section showing an arrangement of memory cells in a DRAM including cell capacitors according to an eighth embodiment of the present invention.
Figure 15B:
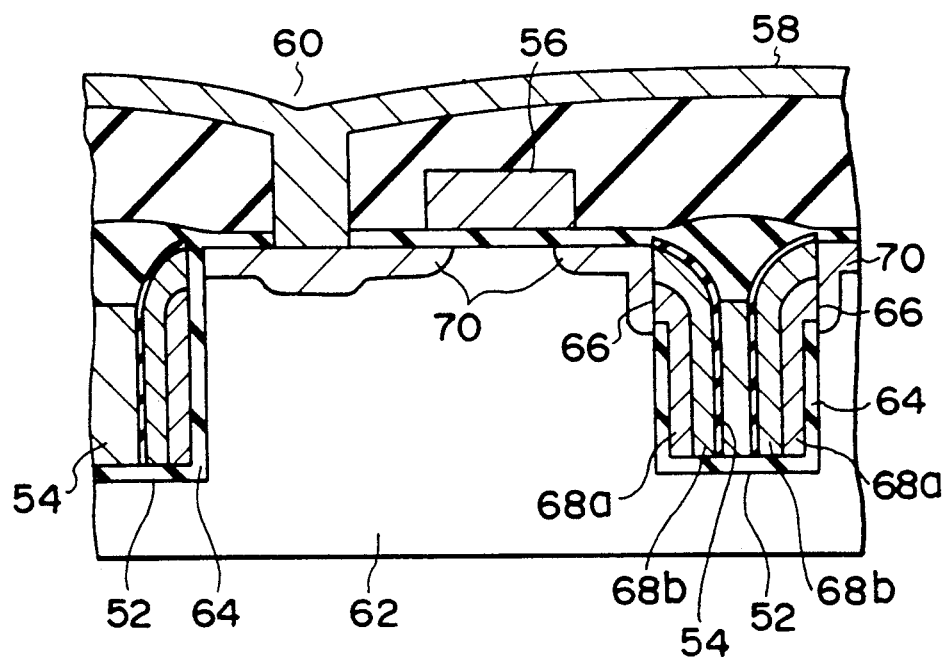

FIGS. 15A and 15B are a plan view and a cross section showing an eighth embodiment wherein this invention is applied to the IVEC cell. In FIGS. 15A and 15B, the structural elements already shown are indicated by the same reference numerals. The eighth embodiment differs from the other embodiments only in that the trench is a groove. Thus, a detailed description of the eighth embodiment may be omitted.

As described above in detail, in order to achieve the object of the present invention, in the cell capacitor of this invention, a trench is formed in a silicon substrate, and an insulation film is formed on the inner wall of the trench. In the case where a cell capacitor is embedded at least in the trench, an information storage electrode of the cell capacitor is constituted by a single electrically conductive layer which is epitaxially grown on the silicon substrate and on a polysilicon film formed on the side wall of the trench.

According to the method of manufacturing the cell capacitor, a trench is formed in a silicon substrate, and an insulation film is formed on the inner wall of the trench. A polysilicon film is formed on the side wall of the trench. At the same time or thereafter, that portion of the silicon substrate, which is located in a region of the side wall of the trench or in a region on the surface of the substrate in the vicinity of the trench, is exposed. Then, a silicon layer is epitaxially and selectively grown on the polysilicon film and on the exposed portion of the silicon substrate. Though the silicon layer is grown separately on the polysilicon layer and on the exposed portion of the substrate, the silicon layer is integrated while it grows. Further, the gate insulation film is formed on the surface of the silicon film, and a counter electrode is formed on the gate insulation film.

According to the above structure and method, the information storage electrode is electrically connected to a source or drain region of a transfer transistor through the silicon layer epitaxially grown from the semiconductor substrate. A natural oxide layer is not formed in an interface between the source or drain region, i.e., the semiconductor substrate and the information storage electrode. Thus, the source or drain region and the information storage electrode can be electrically connected with a low contact resistance. A variation in contact resistance can also be reduced.

As described above, according to the cell capacitor of the present invention, and the method of manufacturing the same, the information storage electrode is formed of the layer which is directly crystal-grown from the silicon substrate. Thus, the influence of a natural oxide film in an interface between the information storage electrode and the source or drain region of the transfer transistor can be eliminated. Consequently, the contact resistance between the information storage electrode and the source or drain region of the transfer transistor can be lowered, and a variation in contact resistance can be reduced.

What is claimed is:

1. A method of manufacturing a cell capacitor of a dynamic random access memory, comprising the steps of:

forming a trench in a semiconductor substrate;

exposing a portion of said semiconductor substrate, which is located in a region on a side wall of said trench;

forming a semiconductor layer on the side wall of said trench;

causing an electrically conductive layer to be epitaxially and selectively grown only on said semiconductor layer and on the exposed portion of said semiconductor substrate, and integrating said electrically conductive layer during the growth;

forming a gate insulation film on a surface of said electrically conductive layer; and forming a counter electrode on said gate insulation film and within said trench.

2. The method according to claim 1, wherein said semiconductor layer has an electrical conductivity.

3. The method according to claim 1, wherein said trench includes a hole.

4. The method according to claim 1, wherein said trench includes a groove.

5. The method according to claim 1, wherein said region on the side wall of the trench includes a plurality of areas, and said electrically conductive layer is formed by epitaxial growth on said semiconductor substrate opening to said plurality of areas on the side wall of the trench, and on said semiconductor layer.

6. The method according to claim 1, wherein said region on the side wall of the trench includes a single area, and said electrically conductive layer is formed by epitaxial growth on said semiconductor substrate opening to said single area on the side wall of the trench, and on said semiconductor layer.

7. A method of manufacturing a cell capacitor of a dynamic random access memory, comprising the steps of:

forming a trench in a semiconductor substrate;

forming an insulation film on an inner surface of said trench;

forming a semiconductor layer on a side wall of said trench;

exposing a portion of said semiconductor substrate, which is located in a region on an upper surface of the semiconductor substrate in the vicinity of said trench;

causing an electrically conductive layer to be epitaxially and selectively grown only on said semiconductor layer and on the exposed portion of said semiconductor substrate, and integrating said electrically conductive layer during the growth;

forming a gate insulation film on the surface of said electrically conductive layer; and forming a counter electrode on said gate insulation film and within said trench.

8. The method according to claim 7, wherein said semiconductor layer has an electrical conductivity.

9. The method according to claim 7, wherein said trench includes a hole.

10. The method according to claim 7, wherein said trench includes a groove.

11. The method according to claim 7, wherein said region on the upper surface of the semiconductor substrate in the vicinity of said trench includes the entire peripheral region of a verge of an opening of the trench, and said electrically conductive layer is formed by epitaxial growth on said entire peripheral region of the verge of the opening of the trench, which is located on the upper surface of the semiconductor substrate, and on said semiconductor layer.

12. The method according to claim 7, wherein said region on the upper surface of the semiconductor substrate in the vicinity of said trench includes a portion of the peripheral region of a verge of an opening of the trench, and said electrically conductive layer is formed by epitaxial growth on said portion of the peripheral region of the verge of the opening of the trench, which is located on the upper surface of the semiconductor substrate, and on said semiconductor layer.

* * * * *